United States Patent

Yamaguchi et al.

[11] Patent Number: 4,639,778
[45] Date of Patent: Jan. 27, 1987

[54] EMBEDDING QUANTIZATION SYSTEM FOR VECTOR SIGNALS

[75] Inventors: Hirohisa Yamaguchi; Kazuo Yamada, both of Tokyo, Japan

[73] Assignee: Kokusai Denshin Denwa Co., Ltd., Tokyo, Japan

[21] Appl. No.: 635,679

[22] Filed: Jul. 30, 1984

[30] Foreign Application Priority Data

Jul. 28, 1983 [JP] Japan ............... 58-136697

[51] Int. Cl.⁴ ............................................ H04N 7/13
[52] U.S. Cl. ................................. 358/135; 358/138; 358/13
[58] Field of Search .............. 358/133, 135, 136, 12, 358/13, 141, 138; 375/31, 33

[56] References Cited

U.S. PATENT DOCUMENTS 3,984,626 10/1976 Mounts et al. ............... 358/133 X
4,125,861 11/1978 Mounts et al. ............... 358/133
4,467,346 8/1984 Mori ........................... 358/12
4,517,596 5/1985 Suzuki ......................... 358/138 X

FOREIGN PATENT DOCUMENTS 0088480 7/1980 Japan ............................... 358/133

OTHER PUBLICATIONS

"Predicitive Quanitizing Systems for the Transmission of Television Signals" in Bell System Technical Journal, May–Jun. 1966, pp. 689–721.

Primary Examiner—Howard W. Britton
Assistant Examiner—Victor R. Kostak
Attorney, Agent, or Firm—Armstrong, Nikaido, Marmelstein & Kubovcik

[57] ABSTRACT

The DPCM (differential pulse code modulation) for color television signal transmission has been improved both in picture quality and information compression, by a vector signal quantization called embedding quantization. According to the present invention, vector signal comprising a plurality of elements is quantized while the quantized output signal is obtained after a plurality of quantization and prediction operations. Number of repetition times of the quantization and prediction is for instance equal to the number of elements composing vector signal. A vector is for instance composed of three elements relating to red, green, and blue primary signals of a color television signal.

7 Claims, 6 Drawing Figures

EMBEDDING QUANTIZATION SYSTEM FOR VECTOR SIGNALS

BACKGROUND OF THE INVENTION

The present invention relates to an embedding quantizing system of vector signal, which is used for instance for DPCM (Differential pulse code modulation) of a color television signal. According to the present invention, a plurality of prediction error signals are quantized simultaneously, and therefore, has the advantage that the picture quality of a color television is improved at places such as edges in a picture, and the information quantity of a picture signal to be transmitted is reduced.

A differential pulse code modulation (DPCM) and predictive quantizing have been known to encode analog signal into digital pulses in order to reduce the information quantity so that the picture information may be transmitted with narrow frequency band and/or in a short time. That DPCM system is described in the Bell System Technical Journal, May–June 1966, pages 689–721.

However, the combination of a prior DPCM system and a prior predictive quantizing is not enough for a high speed transmission of a picture signal. For instance, the high speed transmission within 10 seconds is requested for the transmission of an RGB still picture (red component, green component and blue component of 3 primary colors) with 512×512 picture elements. When the transmission speed is 48 Kbps, the allowable number of the bits for each quantization in that case is less than 3 bits. Considering that each of R, G and B components are usually quantized into 8 bits, large information compression has been requested.

SUMMARY OF THE INVENTION

It is an object of the present invention to overcome the disadvantages and limitations of a prior quantizing system by providing a new and improved predictive quantizing system.

It is also an object of the present invention which provides the more information compression, and improved picture quality.

The above and other objects are attained by an embedding quantization system of a vector signal comprising an input terminal to receive a sampled input signal; a subtractor; a quantizer coupled with output of said subtractor; an adder; a predictor coupled with output of said adder; said subtractor providing difference between input signal and output of said predictor; said adder providing sum of output of said quantizer and output of said predictor; wherein a vector signal composed of a plurality of input signals is applied to said input terminal to accomplish quantization of a vector signal; a prediction and quantization of an input signal are accomplished a plurality of times to provide a plurality of quantized output signals; a switch ($SW_A$) is provided to switch an input of said predictor so that an input signal itself is applied to said predictor at first clock period of embedding quantization operation, and output of said adder is applied to the predictor at other clock periods; a switch $SW_B$ is provided at output of said quantizer to provide quantized output signal to an external circuit; and a quantization control (16) is provided to control said switches $SW_A$ and $SW_B$.

BRIEF DESCRIPTION OF THE DRAWINGS

The foregoing and other objects, features, and attendant advantages of the present invention will be appreciated as the same become better understood by means of the following description and accompanying drawings wherein.

DESCRIPTION OF THE PREFERRED EMBODIMENTS

Figure 1:
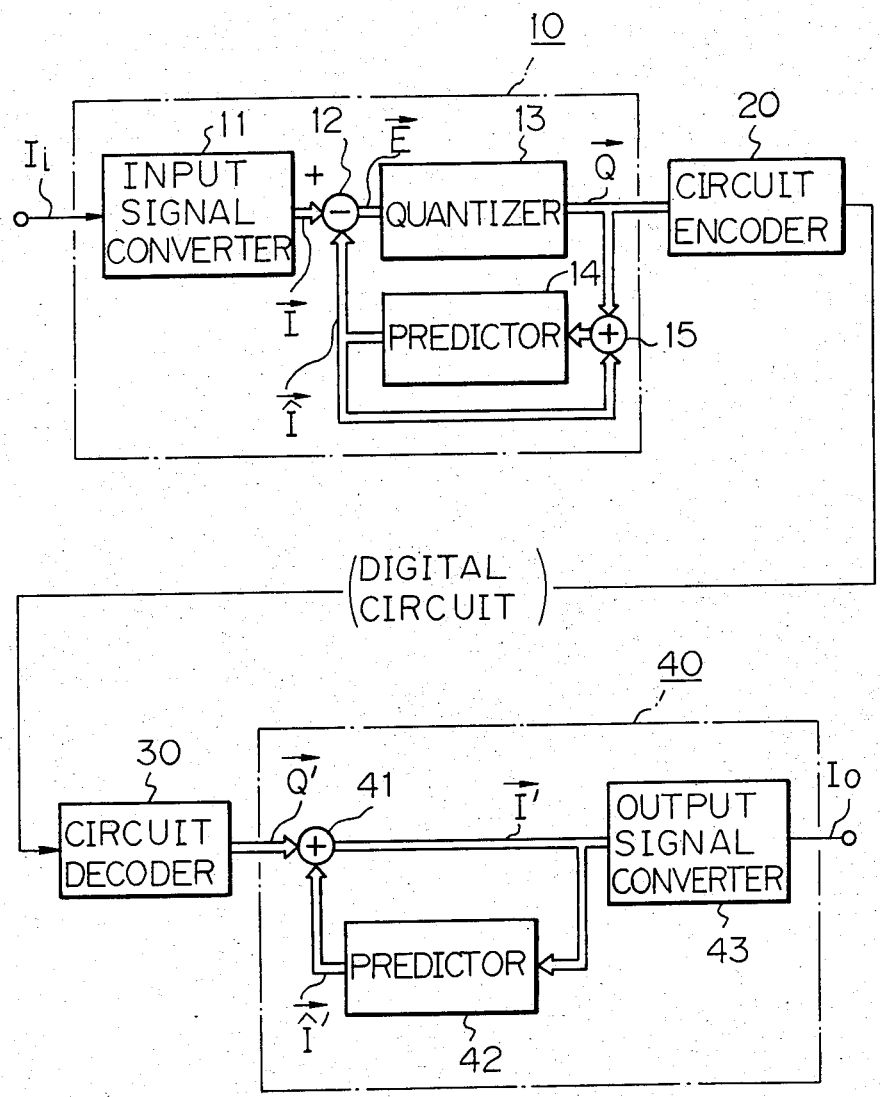
FIG. 1 shows the a brief block diagram of a vector quantization system according to the present invention.

FIG. 1 shows the brief block diagram of the DPCM communication system using the vector quantization according to the present invention, in which the numeral 10 is the encoder which has the input signal converter 10 for converting an input serial signal to a parallel vector signal, the subtractor 12, the quantizer 13, the predictor 14, and the adder 15. The numeral 20 is the circuit encoder which encodes the DPCM vector signal to a circuit code, the numeral 30 is the circuit decoder which decodes the circuit code to a DPCM vector, 40 is the decoder for decoding a DPCM vector signal, and has the adder 41, the predictor 42, and the output signal converter 43 which converts the signal to a serial signal.

The input signal $I_i$ which is a sampled time domain signal, is applied to the input signal converter 11 which converts a plurality of samples (n samples; n is an interger larger than 2) to the vector signal $\vec{I}$ (serial to parallel conversion). The predictive error vector signal $\vec{E}$ is obtained by the subtractor 12 which subtracts the predictive value $\vec{I}$ produced by the predictor 14 from said input vector signal $\vec{I}$. The quantizer 13 quantizes the predictive error vector signal $\vec{E}$ to provide the quantized vector output signal $\vec{Q}$, which is transmitted to a digital circuit through the circuit encoder 20.

In a reception side, the vector signal decoded by the circuit decoder 30 is applied to the adder 41 which adds the predictive value $\vec{I}$ to the input signal to provide the output vector signal $\vec{I'}$, then, the output signal converter 43 converts the parallel vector signal to a serial time domain signal $I_O$.

It is assumed that each signal is indicated as follows.

$$\text{Input vector signal; } \vec{I} = \begin{bmatrix} i_1 \\ \vdots \\ i_n \end{bmatrix} \quad (1)$$

$$\text{Predictive error vector signal; } \vec{E} = \begin{bmatrix} e_1 \\ \vdots \\ e_n \end{bmatrix} \quad (2)$$

$$\text{Predictive value; } \vec{I} = \begin{bmatrix} \hat{i}_1 \\ \vdots \\ \hat{i}_n \end{bmatrix} \quad (3)$$

$$\text{Quantized vector output signal; } \vec{Q} = \begin{bmatrix} q_1 \\ \vdots \\ q_n \end{bmatrix} \quad (4)$$

The corresponding signal in a reception side is expressed by (') (dash).

In FIG. 1, the quantized vector output signal $\vec{Q}$ is shown in the equation 5, where R means the quantization operation.

$$\vec{Q} = R(\vec{E}) = R(\vec{I} - \vec{I}') \quad (5)$$

The vector output signal $\vec{I}'$ of the decoder 40 is shown in the equation 6.

$$\vec{I}' = \vec{I} + \vec{Q} = \begin{bmatrix} \hat{i}_1 + q_1 \\ \hat{i}_2 + q_2 \\ \vdots \\ \hat{i}_n + q_n \end{bmatrix} \quad (6)$$

In a prior art, the square minimum method has been used, that is to say, the quantized vector output signal $\vec{Q}$ is obtained so that the square error D between the input vector signal $\vec{I}$ of the encoder 10 in the quantizer 13 and the output vector signal $\vec{I}'$ in the decoder 40 is minimum.

$$D = (\vec{I} - \vec{I}')^T (\vec{I} - \vec{I}') \quad (7)$$

However, in producing the predictive value $\hat{i}_k (1 \leq k \leq n)$ in the predictor 14, the signal $i_L (1 \leq L \leq (k-1))$, which has already the quantization error is used, the quantization error of that signal and/or the errors of the previous signals are accumulated, and the accumulated error is provided to a part of the component vectors. Therefore, it has been observed that the picture quality in a reception side is considerably deteriorated.

The present invention overcomes the above disadvantage.

The quantization is accomplished to the predictive error vector signal $\vec{E} = (e_1, e_2, \ldots, e_n)'$ and considering the propagation of the quantization error, the quantized vector $\vec{Q}$ is shown as follows.

$$\vec{Q} = \begin{bmatrix} q_1 \\ q_n \end{bmatrix} = R(\vec{I} - \vec{I}) = R\left(\vec{I} - \begin{bmatrix} \hat{i}_1 \\ \hat{i}_n \end{bmatrix}\right) \quad (8)$$

$$= R\left(\vec{I} - \begin{bmatrix} \hat{i}_1 \\ \hat{i}_2(q_1) \\ \hat{i}_3(q_1, q_2) \\ \hat{i}_n(q_1, q_2, \ldots, q_n) \end{bmatrix}\right) \quad (9)$$

Accordingly, the predictive signal $\vec{I}$ itself includes the quantization error of the past prediction error, and therefore, $\vec{I}$ including said error is indicated as $\vec{I} = \vec{I}(\vec{Q})$.

Then, said equations (4) and (5) are corrected as follows.

$$\vec{Q} = R(\vec{I} - \vec{I}(\vec{Q})) \quad (10)$$

where R is the operator of the vector quantization. The final object is to solve the equation (10) and provide the value $\vec{Q}$ which saitisfies the equation (10).

By the way, when the quantized vector output $\vec{Q}$ which satisfies the equation (7) for minimizing the square error, is obtained, said output does not satisfy the equation (10). That is to say, when an output $\vec{Q}_1$ is obtained, the equation (10) might provide another quantization output $\vec{Q}_2$ as shown in the equation (11).

$$\vec{Q}_2 = R(\vec{I} - \vec{I}(\vec{Q}_1)) \quad (11)$$

Further, said output $\vec{Q}_2$ provides another output $\vec{Q}_3$ in the equation (10). Thus, the final result of the embedding operation of the equation (10) is one of the following two statuses.

Status (1); The quantized output $\vec{Q}_1, \vec{Q}_2, \ldots$, converges, that is to say, the final output $\vec{Q}_n$ which satisfies $\vec{Q}_n = R(\vec{I} - \vec{I}(\vec{Q}_n))$ is obtained.

Status (2); The quantized output diverges, or oscillates, that is to say, the following two equations repeat forever.

$$\vec{Q}_n = R(\vec{I} - \vec{I}(\vec{Q}_{n-1})),$$

and $$\vec{Q}_{n-1} = R(\vec{I} - \vec{I}(\vec{Q}_n))$$

but $\vec{Q}_{n-1} \neq \vec{Q}_n$

Our experiment shows that almost all the input picture vectors converges as shown in said status (1), and the vectors diverges as shown in the status (2) are less than 10% of all the vectors. Further, the number of embedding times to reach the convergent status may be less than the number (n) of the elements of the vector. When the status diverges as shown in said status (2), one of the quantized outputs $\vec{Q}_n$ and $\vec{Q}_{n-1}$ is selected so that the square error of the equation (7) is smaller. In that case, we found in the experimentation, that both $\vec{Q}_n$ and $\vec{Q}_{n-1}$ provide the similar picture quality.

Accordingly, the present invention performs the embedding quantization, and provide the quantized output signal which averages the quantization error.

FIG. 2 shows the block diagram of the present embedding quantization encoder, in which the numeral 16 is a quantization control, 17 and 18 are switches (SW$_A$ and SW$_B$), and other numerals as the same as those in FIG. 1 show the same members. The presence of the switches 17 and 18, and the relating control 16 are the important feature of the present invention.

Figure 2A:
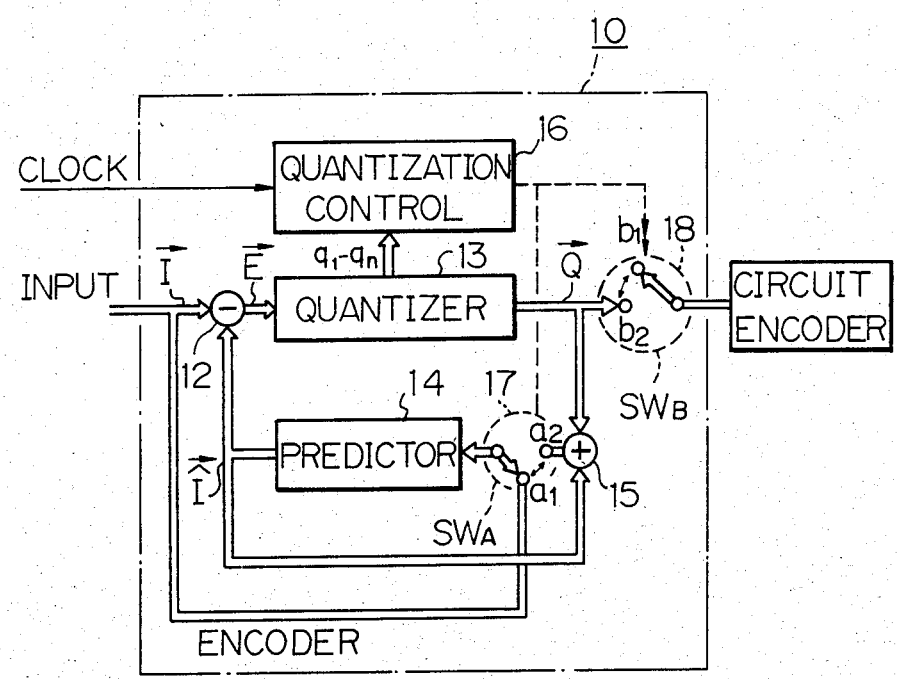
FIG. 2A is a detailed block diagram of the encoder 10 in FIG. 1 for the embedding quantization.
Figure 2B:
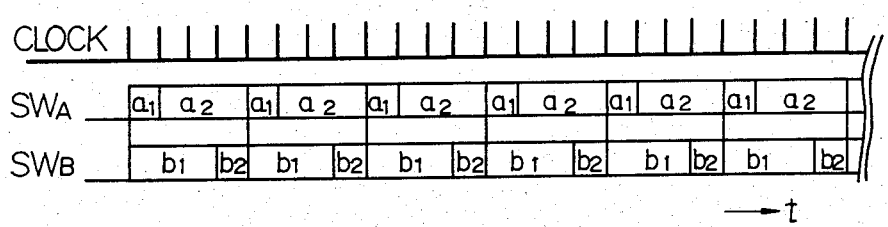
FIG. 2B shows the operational time sequence of the apparatus of FIG. 2A.

FIG. 2B shows the operation of those switches. At the initial stage of each vector, the switch 17 (SW$_A$) is connected to the contact (a$_1$), and said switch is connected to the contact a$_2$ at other duration. The swtich 18 (SW$_B$) is connected to the contact b$_1$ during the embedding operation, and at the final stage of the quantization, the switch 18 is connected to the contact b$_2$ so that the quantized output signal is transmitted to an external circuit. In order to control the switches, a clock pulse which has a pulse signal at each element component position of the vector is provided to the quantization control 16.

At the initial stage, the switch 17 is connected to the contact $a_1$ so that the initial value $\vec{Q}^*$ for the embedding operation is obtained. At that time, the input signal is applied to the predictor 14 through the switch 17, and the initial quantized output $\vec{Q}^*$ which is not suffered from the quantization error is shown below.

$$\vec{Q}^* = R(\vec{I} - \vec{I^*}) = R\left(\vec{I} - \begin{bmatrix} \hat{i}_1^* \\ \hat{i}_2^* \\ \hat{i}_n^* \end{bmatrix}\right) \quad (12)$$

Thus, the initial value $\vec{Q}^*$ is obtained by the input vector signal $\vec{I}$. When the initial value is obtained, the switch 17 is connected to the contact $a_2$.

If that switch 17 were not provided, the particular quantizer for providing the initial value must be installed for providing the square minimum quantization output signal of the equation (7), and therefore, the structure of the apparatus would be complicated because of the presence of the additional quantizer.

When the initial value is obtained, the switch 17 is connected to the contact $a_2$, and the embedding quantization is accomplished by using the output signal as the input signal of the next stage. When the number of the embedding times is (n), the embedding steps are shown as follows.

$$\vec{I} \rightarrow \vec{Q}^*(=\vec{Q}_1) \rightarrow \vec{Q}_2 \rightarrow \vec{Q}_3 \rightarrow \cdots \cdots \rightarrow \vec{Q}_{n+1}$$

When the n times of the embedding operation finishes, the switch 18 is connected to the contact $b_2$ so that the final quantization output $\vec{Q}_{n+1}$ is provided to an external circuit.

Figure 2C:
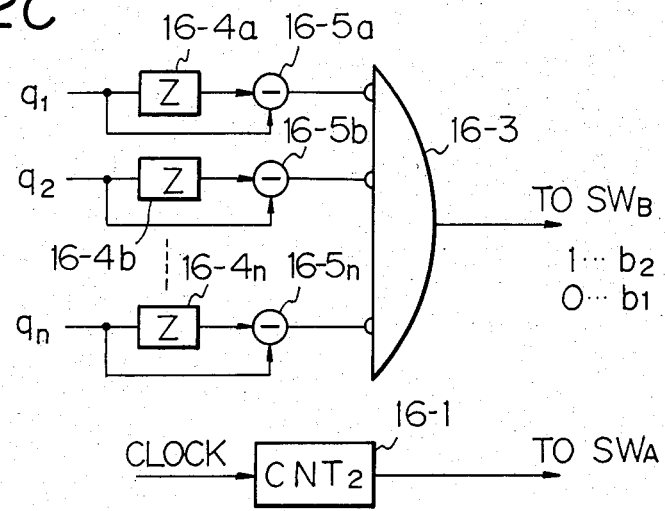
FIG. 2C is the embodiment of the quantization control 16 in FIG. 2A.
Figure 2D:
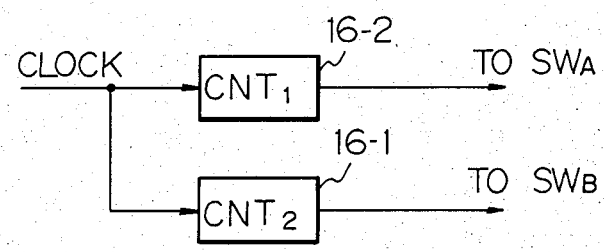
FIG. 2D is another embodiment of the quantization control 16 in FIG. 2A.

The control of the switches 17 and 18 is accomplished by the quantization control 16. FIG. 2C and FIG. 2D show two alternatives of the embodiments of the quantization control 16.

FIG. 2C is the embodiment that the switch 18 is switched when the condition of the equation (10) is satisfied. In the figure, 16-1 is a counter (CNT$_2$) for counting a fixed clock pulse to control the switch 17 (SW$_A$) so that the switch 17 is connected to the contact $a_1$ only at the initial stage of the embedding operation. The operation of that counter 16-1 is quite simple, and the switch 17 is connected to the contact $a_1$ in every predetermined clock pulses. In FIG. 2B, the numeral 16-3 is a NAND circuit, 16-4a through 16-4n are delay circuits each providing the delay equal to the clock period, 16-5a through 16-5n are subtractors, and the input signals $q_1$ through $q_n$ are elements of the vector which is provided by the quantizer 13.

Accordingly, each subtractor (16-5a through 16-5n) provides the output signal zero, when the element signal $q_i$ (i is 1 through n) is equal to the element signal of the previous clock period. And, when the outputs of all the subtractors 16-5a through 16-5n are zero, the NAND circuit provides the output signal one, which is applied to the switch 18 to connect the contact to $b_2$. That condition that the NAND circuit 16-3 provides the outut signal one means that the equation (10) converges.

FIG. 2D is another embodiment of the quantization control 16, in which the numeral 16-1 is the same counter as that of FIG. 2C, and the numeral 16-2 is another counter for counting the clock pulses. The counter 16-2 provides an output signal to connect the switch 18 (SW$_A$) to the contact $b_2$ at the last clock timing. That is to say, when a vector is composed of (m) number of elements, the output of the counter (CNT$_1$) 16-2 is zero for 1 through m−1 clock timing, and is one at the m'th clock timing, so that the switch SW$_A$ is connected to the contact $b_1$ at the first through (m−1)'th clock timing, and is connected to the contact $a_2$ at the m'th clock timing. In the embodiment of FIG. 2D, it is not assured that the equation (10) is converged. But, as mentioned before, it is enough to repeat the embedding operation by the times equal to the number of the elements of a vector, so the configuration of FIG. 2D is enough for actual operation for encoding a picture signal.

The quantizer 13 in FIG. 2A may be a ROM (read only memory) which stores the quantization characteristics, and is read out by applying a predictive error signal to that ROM as an address signal. Thus, a quantization is accomplished by a single read out operation of that ROM.

The predictor 14 may be a conventional one which uses predictive algorithm in a prior scalor coding technology.

Figure 3:
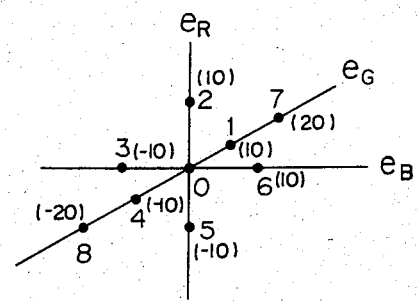
FIG. 3 shows an example of the vector coordinates according to the present invention.

Finally, FIG. 3 shows an example of the vector coordinates of the output signal accomplished by such circuit encoder 20. FIG. 3 is the embodiment that the number of the elements of a vector is 3, although the previous description is described for the embodiment that the number of the elements is 4.

The encoder 10 of FIG. 2A provides the quantized vector signal having the elements $e_R$, $e_G$ and $e_G$. It is supposed that each element may take a few status, because it is encoded thorugh a DPCM encoding. The output of the circuit encoder 20 is one of 0 through 8, each of which represents the status of the elements as shown in the table below.

|   | $e_R$ | $e_B$ | $e_G$ |
| --- | --- | --- | --- |
| 0 | 0 | 0 | 0 |
| 1 | 0 | 0 | 10 |
| 2 | 10 | 0 | 0 |
| 3 | 0 | −10 | 0 |
| 4 | 0 | 0 | −10 |
| 5 | −10 | 0 | 0 |
| 6 | 0 | 10 | 0 |
| 7 | 0 | 0 | 20 |
| 8 | 0 | 0 | −20 |

For instance, when the output of the circuit encoder 20 is 8, it represents that the element $e_R$ is 0, the element $e_B$ is 0, and the element $e_G$ is −20. Thus, a color picture cell is encoded to approximately 3 bits (0–8).

From the foregoing, it will now be apparent that a new and improved embedding quantizing system has been found. It should be understood of course that the embodiments disclosed are merely illustrative and are not intended to limit the scope of the invention. Reference should be made to the appended claims, therefore, rather than the specification as indicating the scope of the invention.

What is claimed is:

1. In an embedding quantization system of a vector signal comprising:
   an input terminal for receiving a sampled input signal;
   a quantizer;
   a predictor having an input coupled to the output of said quantizer;

a subtractor for providing the difference between the input signal and the output of said predictor, to said quantizer;

wherein the input signal applied to said input terminal is a vector signal which is subject to quantization;

an adder means for providing a sum of the output of said quantizer and the output of said predictor, to the input of said predictor, wherein a prediction by said predictor and a quantization by said quantizer are input of said predictor, wherein a prediction by said predictor and a quantization by said quantizer are accomplished a plurality of times by feeding back the output of said predictor to the input of said predictor through said adder means to provide a plurality of quantized output signals;

a quantization control means;

a first switch for switching the input of said predictor wherein the input signal is applied to said predictor at a first clock period for the embedding quantization operation, and the output of said adder is applied to the predictor at other clock periods controlled by said quantization control means; and a second switch, coupled to the output of said quantizer, for providing quantized output signals to an external circuit under the control of said quantization control means.

2. An embedding quantization system of a vector signal according to claim 1, wherein said quantization control means comprises a coincidence detection means for detecting when the output of said quantizer coincides with the output of said quantizer at one clock period before so that said second switch connects the quantizer output to said external circuit when said coincidence detection means detects coincidence, and a counter for counting a clock pulse to provide an output signal therefrom to said first switch so that said predictor is coupled to the input signal only at an initial stage of the embedding quantization operation.

3. An embedding quantization system of a vector signal according to claim 2, wherein said coincidence detection means comprises a plurality of delay means for delaying the signal applied thereto by one clock period, a plurality of subtractors for subtracting the output of said delay means from an input signal applied thereto, and logical product means for providing an output signal when all of said subtractors provide a zero output signal.

4. An embedding quantization system of a vector signal according to claim 1, wherein said quantization control means comprises a first counter to provide an output signal therefrom to said first switch so that said predictor is coupled to an input signal thereto only at an initial stage of the embedding quantization operation, and a second counter to provide an output signal therefrom to said second switch so that the output of said quantizer is coupled to the external circuit at a final clock pulse period in each vector quantization.

5. An embedding quantization system of a vector signal according to claim 1, wherein the number of repetitions of embedding quantization by said predictor and said quantizer is equal to the number of elements of the vector signal which is being quantized.

6. An embedding quantization system of a vector signal according to claim 1, further comprising a circuit encoder coupled to the output of said second switch for encoding the quantized vector signal to a single digital value.

7. An embedding quantization system of a vector signal according to claim 1, wherein the vector signal has three elements corresponding to red, green and blue primary colors for transmission of a color picture television signal.

* * * * *